US012721097B2

(12) United States Patent
Fuller et al.

(10) Patent No.: US 12,721,097 B2
(45) Date of Patent: Aug. 25, 2026

(54) METHOD AND DEVICE TO REGULATE PURGE INTO A CONTAINER

(71) Applicant: ENTEGRIS, INC., Billerica, MA (US)

(72) Inventors: Matthew A. Fuller, Colorado Springs, CO (US); Mark V. Smith, Colorado Springs, CO (US); Shawn D. Eggum, Lonsdale, MN (US); Thomas H. Wilkie, Colorado Springs, CO (US); Colton J. Harr, Monument, CO (US); Michael C. Zabka, New Prague, MN (US)

(73) Assignee: ENTEGRIS, INC., Billerica, MA (US)

( * ) Notice: Subject to any disclaimer, the term of this patent is extended or adjusted under 35 U.S.C. 154(b) by 536 days.

(21) Appl. No.: 17/972,093

(22) Filed: Oct. 24, 2022

(65) Prior Publication Data

US 2023/0131451 A1 Apr. 27, 2023

Related U.S. Application Data

(60) Provisional application No. 63/272,281, filed on Oct. 27, 2021.

(51) Int. Cl.
*H10P 72/30* (2026.01)
*H10P 72/00* (2026.01)
*H10P 72/10* (2026.01)

(52) U.S. Cl.
CPC ...... *H10P 72/3218* (2026.01); *H10P 72/0604* (2026.01); *H10P 72/1926* (2026.01); *H10P 72/3302* (2026.01)

(58) Field of Classification Search
CPC ........... H01L 21/6773; H01L 21/67253; H01L 21/67393; H01L 21/67742;
(Continued)

(56) References Cited

U.S. PATENT DOCUMENTS 5,988,233 A * 11/1999 Fosnight ........... H01L 21/67376 414/217
8,146,623 B2 * 4/2012 Tieben .............. H01L 21/67393 414/940
(Continued)

FOREIGN PATENT DOCUMENTS

EP 3680930 A1 7/2020
JP 2018098358 A 6/2018
(Continued)

OTHER PUBLICATIONS

KR-102190920-B1 English Translation of Specification (Year: 2024).*
(Continued)

*Primary Examiner* — Kenneth Rinehart
*Assistant Examiner* — Stephanie A Shrieves

(57) ABSTRACT

Substrate containers include purge flow distribution systems. The purge flow distribution systems can divide one or more input flows of purge gas to a plurality of gas distribution surfaces of a network of gas distribution devices. Methods of controlling purge can include configuring the substrate containers to provide determined purge gas flow rates at each of the gas distribution surfaces. The configuration can be performed using flow controls of the purge flow distribution systems. The purge gas flow rates can be determined based on purge performance parameters. A controller can direct the operation of the purge flow distribution systems. The controller and the substrate container can be combined in a substrate container purging system.

18 Claims, 7 Drawing Sheets

(58) Field of Classification Search
CPC ........... H01L 21/67017; H10P 72/3218; H10P 72/0604; H10P 72/1926; H10P 72/3302; H10P 72/0402
USPC .............................................................. 141/4
See application file for complete search history.

(56) References Cited

U.S. PATENT DOCUMENTS 9,054,144 B2 * 6/2015 Burns ............... H01L 21/67376
9,441,792 B2 * 9/2016 Ng .......................... H01L 21/00
11,075,100 B2 * 7/2021 Woo .................... H10P 72/1922
11,380,567 B2 * 7/2022 Yoon ................... H10P 72/1926
2002/0120425 A1 * 8/2002 Hasper ............. H01L 21/67253 702/182
2009/0053017 A1 * 2/2009 Shmuelov ......... H01L 21/67393 414/217
2013/0213442 A1 * 8/2013 Kaise ................ H01L 21/67393 134/22.18
2016/0351427 A1 12/2016 Murata et al.
2017/0140949 A1 * 5/2017 Onishi ................. G05D 7/0635
2018/0247846 A1 * 8/2018 Murata ............. H01L 21/67389
2019/0371640 A1 * 12/2019 Raisanen .......... H01L 21/67017
2020/0020549 A1 * 1/2020 Ogawa .................. F16K 15/026
2020/0176293 A1 6/2020 Lee et al.
2020/0227295 A1 * 7/2020 Murata .................... B65G 1/00
2021/0235583 A1 * 7/2021 Yang .................... H05K 3/0055
2021/0280446 A1 9/2021 Fuller et al.
2021/0323756 A1 * 10/2021 Chiu ...................... B65D 81/18
2023/0054753 A1 2/2023 Chiu et al.

FOREIGN PATENT DOCUMENTS

KR 20160014169 A 2/2016
KR 102190920 B1 * 12/2020
KR 20210055483 A * 5/2021
KR 20210101029 A * 8/2021

OTHER PUBLICATIONS

KR-20210055483-A English Translation of Specification (Year: 2024).*
KR-20210101029-A English Translation of Specification (Year: 2024).*

* cited by examiner

METHOD AND DEVICE TO REGULATE PURGE INTO A CONTAINER

PRIORITY

This disclosure claims priority to U.S. provisional patent application No. 63/272,281 with a filing date of Oct. 27, 2021. The priority document is hereby incorporated by reference.

FIELD

This disclosure is directed to methods and systems for controlling purge into a container, particularly providing controllable flow of purge into a wafer container.

BACKGROUND

Substrates in the form of wafers can be processed to form semiconductor devices. The wafer substrates, or simply substrates, undergo a series of process steps. Exemplary process steps can include, but are not limited to, material layer deposition, doping, etching, or chemically or physically reacting material(s) of the substrate. A substrate container is used to store and transport the in-process wafers between process steps within the fabrication facility. During some process steps, the substrates are processed by processing equipment within a clean environment (e.g., a clean room). During processing, gasses must be introduced and removed from the substrate container such as a front opening unified pods (FOUP), for example during purge processes, thus requiring that the FOUP have one or more locations at which gas may enter or leave the FOUP. Substrates can be transferred from the substrate container to the processing tool through an equipment front end module (EFEM). The EFEM generally includes a load port for receiving the substrate container, a transfer unit, a frame or "mini-environment", and a fan filter unit used to generate gas flow within the EFEM.

In use, the substrate container is docked on a load port, and the door of the of the substrate container is opened to allow access to substrates within. Next, the door is disengaged from the substrate container which permits the transfer unit housed within the EFEM to access the substrates contained within the substrate container for processing. A flow of gas introduced by the fan filter unit flows through the EFEM in a direction from a top of the EFEM to a bottom of the EFEM. When the front opening of the substrate container interfaces with the load port opening of the EFEM some of the gas flowing through the EFEM and across the load port opening may be inadvertently directed into the interior of the container, potentially interfering with the purging capabilities of the substrate container by temporarily causing an increase in the relative humidity and/or oxygen levels within the microenvironment of substrate container, which can be undesirable.

Purge gases can be used to remove or prevent entry of contaminants into spaces within substrate container. The purge gases are typically provided by way of a diffuser tower provided for each port configured to receive purge gas, providing a standard flow rate based on the supply of purge gas to the port.

SUMMARY

This disclosure is directed to methods and systems for controlling purge into a container, particularly providing controllable flow of purge into a wafer container.

In embodiments, the distribution of purge gas within a substrate container can be controlled such that the purging of the substrate container is improved. The distribution can be controlled using flow controls such as valves. The flow from multiple gas distribution devices in a network can provide improved purge flow, improving the removal of undesirable contaminants such as moisture or particulate from the substrate container. This can reduce losses and improve yield for processes including the substrate container.

In an embodiment, a method of controlling flow of purge gas into a substrate container includes determining purge gas flow rates for each of a plurality of gas distribution surfaces of a network of gas distribution devices of the substrate container, based on one or more purge performance parameters. The method further includes configuring a purge flow distribution system of the substrate container to divide one or more input flows such that the determined purge gas flow rates are provided to each of the plurality of gas distribution surfaces.

In an embodiment, the purge flow distribution system includes a plurality of flow paths, each flow path configured to allow flow of purge gas to one of the plurality of gas distribution surfaces, the flow paths configured such that when a predetermined input of the purge gas is provided, each of the plurality of gas distribution surfaces provide the determined purge gas flow rates.

In an embodiment, the substrate container comprises one or more flow controls included in the purge flow distribution system, the one or more flow controls configured to direct purge gas to each of the plurality of gas distribution surfaces, the method further comprising adjusting the one or more flow controls to control the flow of the purge gas to the plurality of gas distribution surfaces.

In an embodiment, the one or more flow controls include a valve.

In an embodiment, the one or more flow controls include a flow restrictor.

In an embodiment, the determined purge gas flow rates are different for each of the plurality of gas distribution surfaces.

In an embodiment, determining the purge gas flow rates is performed during when substrates are located in the substrate container.

In an embodiment, determining the purge gas flow rates is performed in response to a change in an operational state of the substrate container.

In an embodiment, determining the purge gas flow rates is performed in response to a change in at least one of the one or more purge performance parameters.

In an embodiment, a substrate container includes a shell defining an interior space, a plurality of gas distribution surfaces located within the interior space, a purge gas inlet configured to receive a purge gas, and a purge flow distribution system. The purge flow distribution system is connected to the purge gas inlet. The purge flow distribution system includes a plurality of flow paths, each flow path configured to provide the purge gas to one of the plurality of gas distribution surfaces; and one or more flow controls, each of the one or more flow controls configured to affect flow through at least one of the plurality of flow paths.

In an embodiment, the one or more flow controls include a valve. In an embodiment, the valve is one of a needle valve, a ball valve, or a butterfly valve.

In an embodiment, the one or more flow controls include a flow restrictor.

In an embodiment, a substrate container purging system includes a substrate container as described herein and a controller, the controller configured to adjust at least one of the one or more flow controls such that the plurality of gas distribution surfaces provide target purge gas flow rates.

In an embodiment, the controller is further configured to determine the target purge gas flow rates based on one or more purge performance parameters.

In an embodiment, the controller is configured to determine the target purge gas flow rates during when substrates are located in the substrate container. In an embodiment, the controller is configured to determine the target purge gas flow rates in response to a change in an operational state of the substrate container. In an embodiment, determining the target purge gas flow rates is performed in response to a change in at least one of the one or more purge performance parameters.

In an embodiment, the controller is configured to receive the target purge gas flow rates.

In an embodiment, the substrate container purging system further includes one or more sensors configured to measure one or more purge performance parameters.

DRAWINGS

DETAILED DESCRIPTION

This disclosure is directed to methods and systems for controlling purge into a container, particularly providing controllable flow of purge into a wafer container.

Figure 1A:
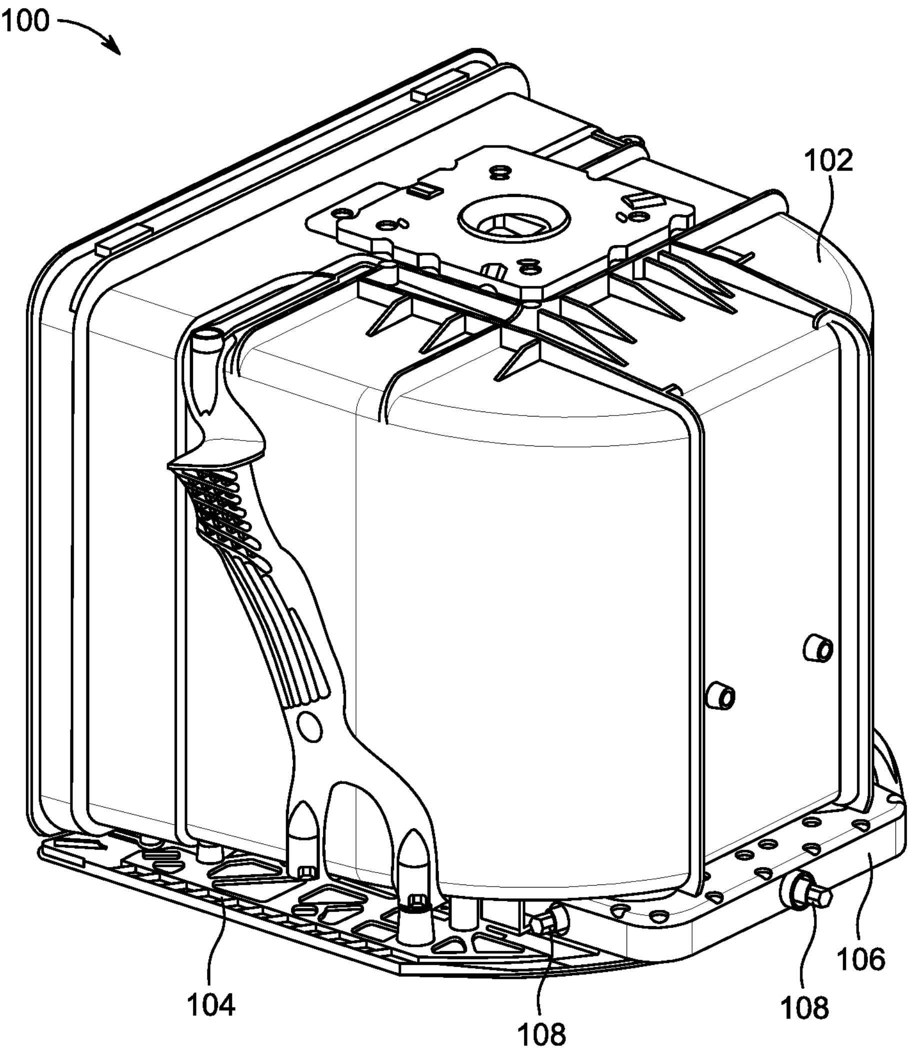
FIG. 1A shows a perspective view of a substrate container according to an embodiment.

FIG. 1A shows a substrate container according to an embodiment. Substrate container 100 includes container body 102, carrier plate 104, and purge flow distribution system base 106.

Substrate container 100 is a container configured to accommodate one or more substrates for transport, storage, and/or processing of those substrates. The substrates contained in substrate container 100 can be, for example, semiconductor substrates such as wafers. The substrate container can be any suitable container for the substrate, such as a front opening uniform pod (FOUP). In an embodiment, the substrate container can be a container for a reticle, such as a reticle pod. In such an embodiment, the container body 102 can be included as at least part of an outer pod configured to contain an inner pod, with the flow distribution system including flow distribution system base 106 being configured to provide the purge gas to an interior space of the outer pod.

Container body 102 defines an internal space (shown in FIG. 1B) capable of containing one or more substrates, such as wafers for processing. A front opening (shown in FIG. 1B) can allow the substrates to be inserted into or removed from container body 102. Carrier plate 104 can provide a base that the container body 102 can be attached to.

Purge flow distribution system base 106 can be included in substrate container 100. The purge flow distribution system base 106 can be part of a purge flow distribution system configured to distribute purge flows to a network of gas distribution devices. The purge flows can be of any suitable gas that does not contaminate the environment within container body 102. Non-limiting examples of the purge flow gas can be nitrogen, clean dry air (CDA), or the like. The purge flow distribution system base 106 can include a plurality of flow controls 108. The flow controls 108 are configured to control an amount of the purge flow that can be provided to each of a plurality of gas distribution devices (such as gas distribution device 112 shown in FIG. 1B) included in substrate container 100. The flow controls 108 can be controlled to provide determined flow rates of purge gas at each of a plurality of gas distribution surfaces included in a network of gas distribution devices provided in the substrate container 100. Purge flow distribution system base 106 is configured to receive a flow of purge gas and divide the flow to gas distribution surfaces of the network of gas distribution devices. In an embodiment, a portion of purge flow distribution system base 106 can be located within the container body 102. In an embodiment, the purge flow distribution system base 106 can be located adjacent to the container body 102. In an embodiment, the purge flow distribution system base 106 can be at least partially disposed between the container body 102 and the carrier plate 104.

Figure 1B:
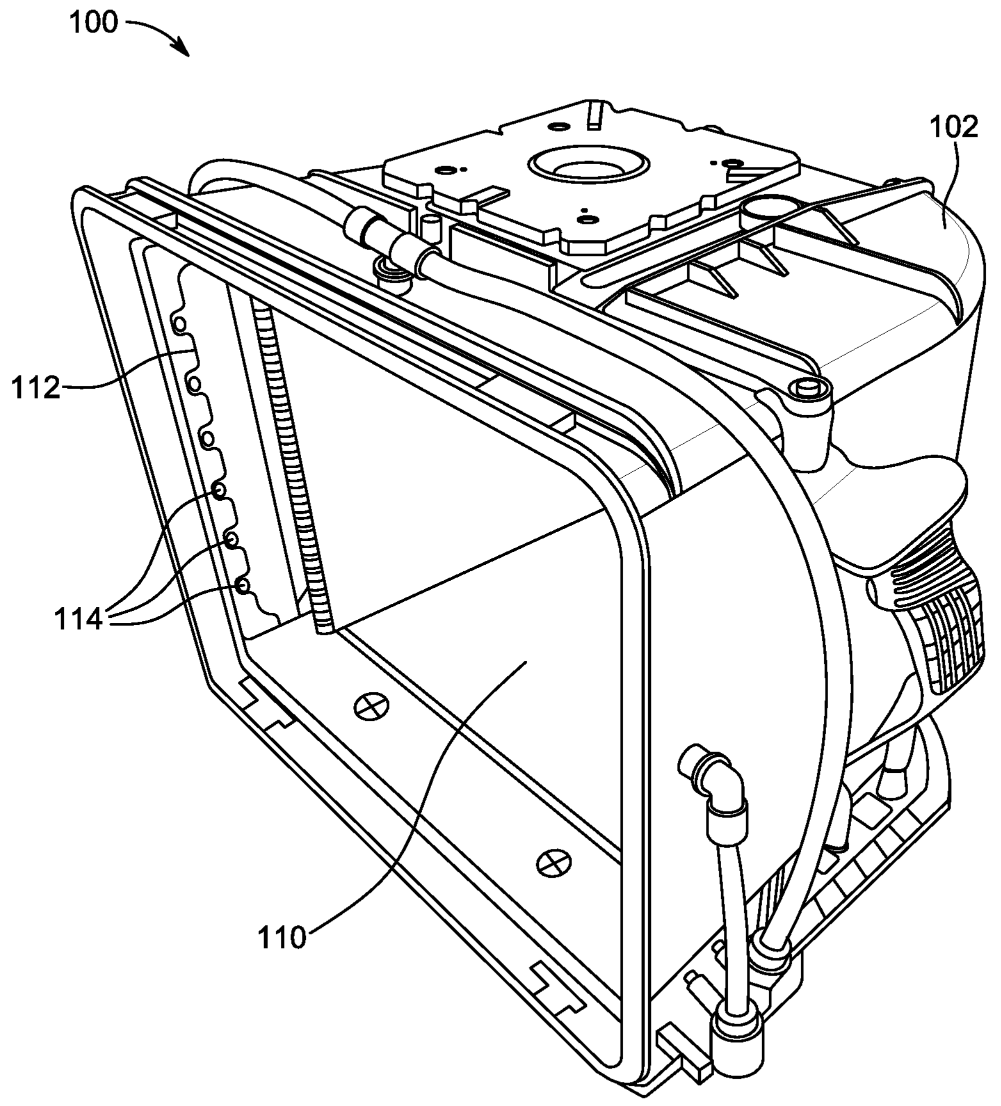
FIG. 1B shows another perspective view of the substrate container of FIG. 1A.

FIG. 1B shows another perspective view of the substrate container 100 of FIG. 1A. In the perspective view of FIG. 1B, the internal space 110 of container body 102 is visible. In the internal space 110, a gas distribution device 112 can be seen. The gas distribution device 112 includes gas distribution surfaces 114.

Internal space 110 is an internal space of container body 102, configured to accommodate one or more substrates, such as semiconductor wafers. The internal space 110 is defined by the container body 102. The gas distribution devices 112 are distributed around the internal space 110. In the view of FIG. 1B, the gas distribution device 112 that is visible is located on a side wall of the container body 102 within the internal space 110. In embodiment, a network including a plurality of gas distribution devices 112 is provided in substrate container 100. Additional gas distribution devices can be located, for example, on the side wall opposite the side wall including the gas distribution device 112 shown in FIG. 1, along the top of the internal space 110, as diffuser towers extending into the internal space 110, or any other suitable position allowing the gas distributing device 112 to provide purge gas to the internal space 110 without interfering with the ability to store substrates within internal space 110. The gas distribution device 112 includes gas distribution surfaces 114 distributed along the gas distribution device 112. In the embodiment shown in FIG. 1B, the gas distribution device includes multiple gas distribution surfaces 114. In an embodiment, one or more of gas distribution devices 112 may include a single gas distribution surface 114.

Figure 2A:
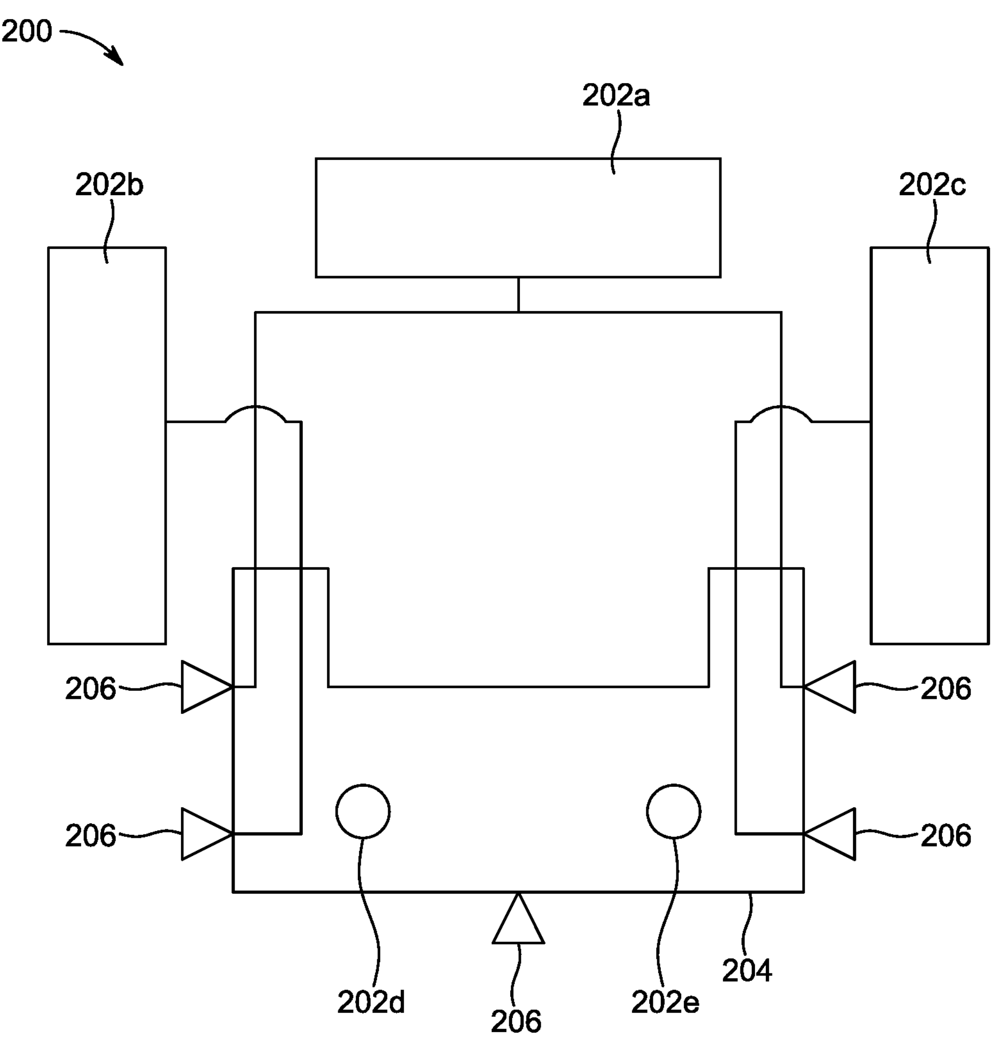
FIG. 2A shows a schematic of a purge flow distribution system according to an embodiment.

FIG. 2A shows a schematic of a purge flow distribution system according to an embodiment. Purge flow distribution system 200 includes a plurality of gas distributing devices 202*a*, 202*b*, 202*c*, 202*d*, and 202*e*. The purge flow distribution system 200 includes purge flow distribution system base 204. Valves 206 are provided to control the flow of purge gas from purge flow distribution system base 204 into fluid lines 208*a*, 208*b*, 208*c*, and to gas distributing devices 202*d* and 202*e*.

Gas distributing devices 202*a-e* are devices each configured to receive a portion of a purge flow and distribute that flow to an interior space of a substrate container in which the gas distributing devices 202*a-e* are provided, such as substrate container 100 described above and shown in FIGS. 1A and 1B. The gas distributing devices 202*a-e* can each include at least one gas distribution surface. The gas distributing devices 202*a-e* can each include, for example, a manifold connected to a plurality of gas distribution surfaces, a diffuser tower, a flow channel configured to direct flow to a gas distribution surface, or the like. In an embodiment, gas distributing devices 202*a-e* can be distributed in an interior space defined within a reticle pod, for example within an outer pod of a reticle pod.

Gas distributing device 202*a* can be a device positioned at or near a ceiling of an internal space of a substrate container into which purge flow distribution system 200 is included. Gas distributing device 202*b* and gas distributing device 202*c* can each be, for example, gas distributing devices provided along side walls of the internal space of the substrate container into which purge flow distribution system 200 is included, such as gas distributing device 112 as described above and shown in FIGS. 1A and 1B. Gas distributing devices 202*b* and 202*c* can provide flow paths to gas distribution surfaces provided on each respective gas distributing device Gas distributing devices 202*d* and 202*e* are diffuser towers provided towards a rear of an internal space of the substrate container into which purge flow distribution system 200 is included, such as substrate container 100 as described above and shown in FIGS. 1A and 1B. The diffuser towers can be, for example, tubes of a porous material configured to allow purge gas to diffuse out of the gas distributing devices 202*d* and 202*e* into the internal space of the substrate container.

Purge flow distribution system base 204 is configured to receive a flow of purge gas and divide the flow of purge gas among the gas distributing devices 202*a-e*. The flow of purge gas can be any suitable purge gas for purging the substrate container, such as nitrogen, CDA, or the like. The flow of purge gas can be supplied from a purge gas source, such as a port or line provided on a tool that the substrate container is used with. The purge flow distribution system base 204 can include flow controls 206 to control the division of the flow of purge gas. Flow controls 206 are provided in purge flow distribution system base 204 such that at least one of the flow controls 206 can be used to control flow to each of the gas distributing devices 202*a-e*. The purge flow distribution system base 204 is shown in detail in FIGS. 2B and 2C and described in further detail below. The flow controls 206 can be any suitable flow controls for adjusting the flow to the respective one of the gas distributing devices 202*a-e*. As a non-limiting example, the flow controls 206 can be valves, such as needle valves, butterfly valves, ball valves, or the like. In an embodiment, each of the flow controls 206 is independently controllable. In an embodiment, each of the flow controls 206 is actuated such that it can automatically respond to a command, for example a signal from a controller. In an embodiment, each of the flow controls 206 can be manually adjusted. In an embodiment, the flow controls 206 can be adjusted while the substrate container including purge flow distribution system 200 is in use, for example during processing, transport, or storage of substrates container within an internal space of the substrate container.

Figure 2B:
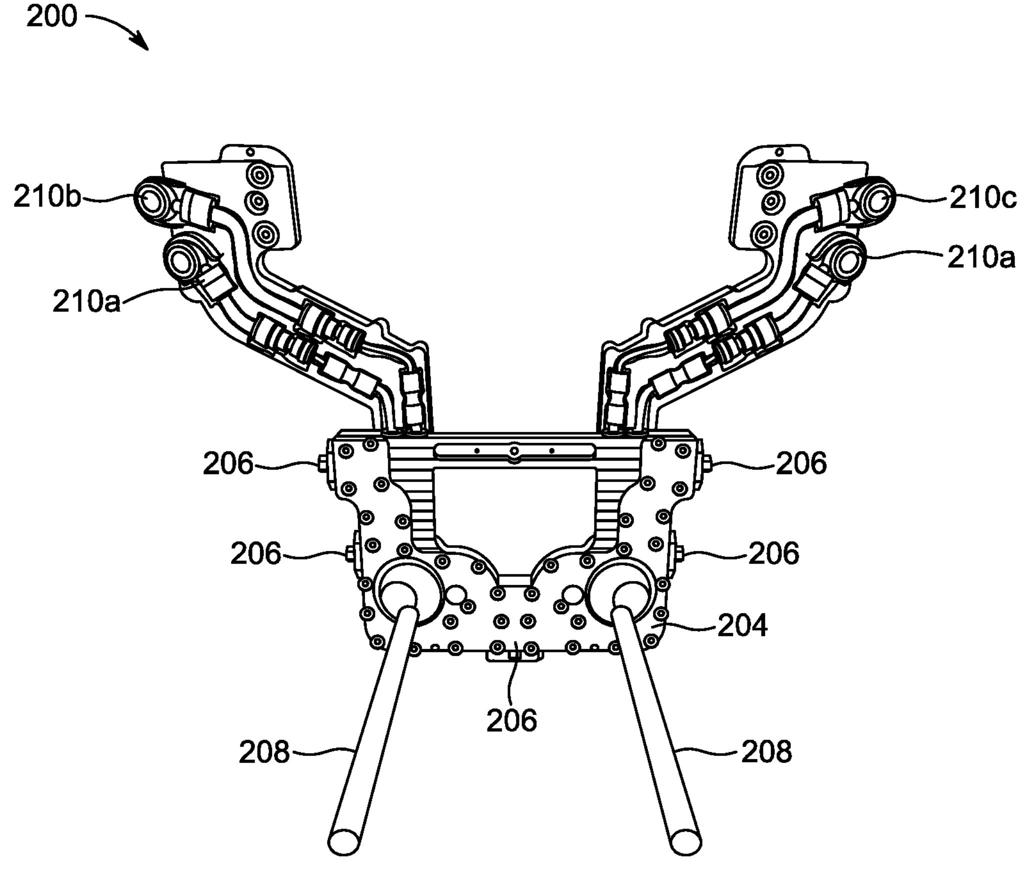
FIG. 2B shows a purge flow distribution system according to the schematic in FIG. 2A

FIG. 2B shows a purge flow distribution system according to the schematic in FIG. 2A. Purge flow distribution system 200 includes purge flow distribution system base 204 and flow controls 206. Purge flow distribution system 200 further includes diffuser towers 208. The purge flow distribution system 200 as shown in FIG. 2B further includes connectors 210*a-c*. Connector 210*a* is configured to provide purge gas routed through the purge flow distribution system base 204 to the gas distribution device 202*a*. Connector 210*b* is configured to provide purge gas routed through the purge flow distribution system 204 to the gas distribution device 202*b*. Connector 210*c* is configured to provide purge gas routed through the purge flow distribution system 204 to the gas distribution device 202*c*. Diffuser towers 208 are the gas distribution devices 202*d* and 202*e* in the embodiment shown in FIG. 2B. The diffuser towers 208 are tubes of porous material having closed ends, configured to supply purge gas to an interior of the substrate container including purge flow distribution system 200. In the embodiment shown in FIG. 2B, two of the flow controls 206 control flow to the connectors 210*a*, one of the flow controls 206 controls flow to the connector 210*b*, and one of the flow controls 206 controls flow to the diffuser towers 208.

Figure 2C:
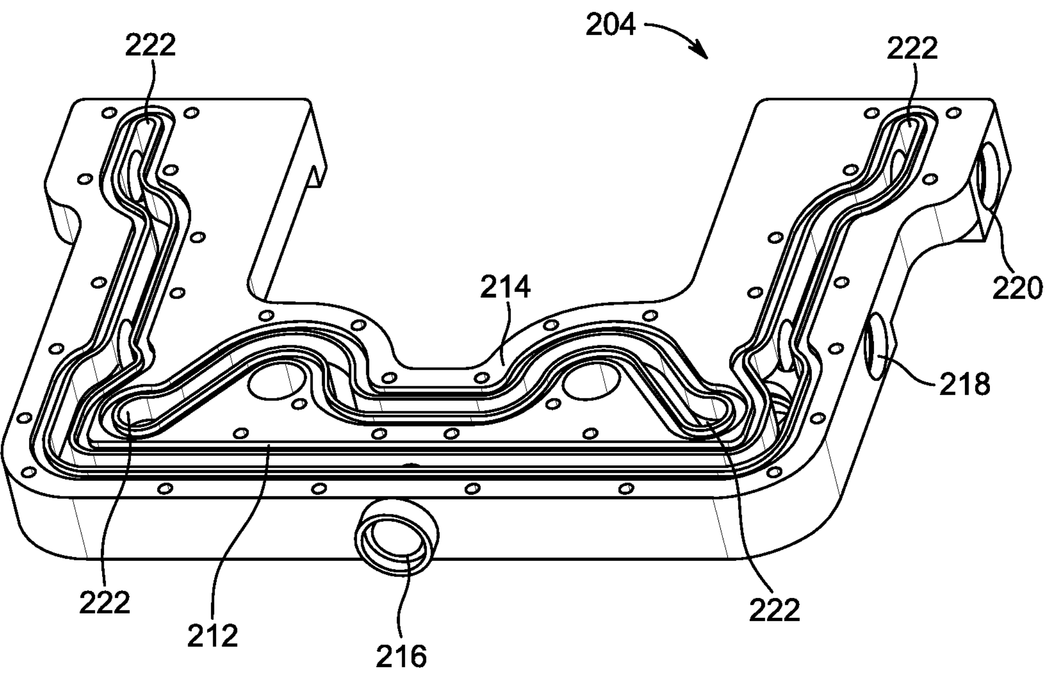
FIG. 2C shows a sectional view of the purge flow distribution base of the purge flow distribution system of FIG. 2B.

FIG. 2C shows a sectional view of the purge flow distribution base of the purge flow distribution system of FIG. 2B. Purge flow distribution base 204 includes a first channel 212, a second channel 214, first valve aperture 216, second valve apertures 218, and third valve apertures 220.

First channel 212 can receive a flow of purge gas from an inlet (not shown) which can be on an opposite side of the purge flow distribution base from the perspective of the view of FIG. 2C. The first channel 212 is configured to convey the flow of purge gas through at least a portion of first channel 212, based on the state of flow controls such as flow controls 206 described above and shown in FIGS. 2A and 2B. First channel 212 can provide flow paths to second channel 214, and to gas distribution devices 202*a-c*, with these flow paths being controlled by the flow controls 206 as discussed above and shown in FIGS. 2A and 2B. The flow controls 206 can be valves disposed in the first, second, and third valve apertures 216, 218, 220. The first valve aperture 216 can accommodate a valve or other flow control 206 configured to control flow between first channel 212 and second channel 214. Second channel 214 can receive purge gas from the first valve aperture 216 and provide a flow path directing the purge gas to the second channel ends 222. Second channel ends 222 can be positions where gas distribution devices 202*d* and 202*e* such as the diffuser towers 208 receive the purge gas to be distributed into the interior space of the substrate container. The second valve apertures 218 can each accommodate a valve or other flow control 206 configured to receive at least some flow from first channel 212 and selectively direct purge gas to one of the gas distribution devices 202*b* or 202*c*, for example by way of one of connectors 210*b* or 210*c*. While one second valve aperture 218 is visible in the view of FIG. 2C, it is understood that another second valve aperture 218 can be provided on an opposite side of the purge flow distribution base 204 shown in FIG. 2C. The third valve apertures 220 can each accommodate a valve or other flow control 206 configured to control flow through first channel 212 to first channel ends 224. At each of first channel ends 224, the flow gas can pass to connectors 210*a* as shown in FIG. 2B and then to gas distribution device 202*a*.

Figure 2D:
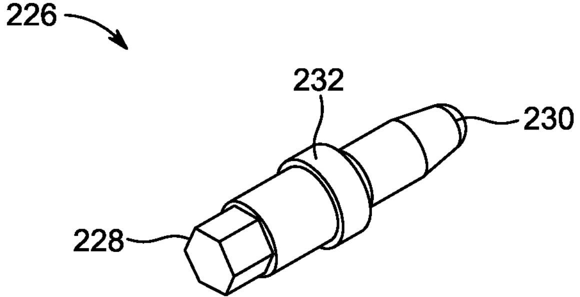
FIG. 2D shows a valve configured to be used with the purge flow distribution base of FIG. 2C.

FIG. 2D shows a valve configured to be used with the purge flow distribution base of FIG. 2C. The valve 226 can be inserted into one of the first, second, or third valve apertures 216, 218, 220 as shown in FIG. 2C. In the embodiment shown in FIG. 2D, the valve 226 forms a needle valve when inserted into one of the valve apertures 216, 218, 220 to provide one of the flow controls 206 described above and shown in FIGS. 2A and 2B. The valve 226 can include engagement end 228, needle end 230, and aperture engaging body 232. The engagement end 228 can be provided outside the gas distribution system base 205 when the valve 226 is inserted into one of the valve apertures 216, 218, 220. The engagement end 228 can include features allowing the valve to be engaged with such that it can be manipulated, such as the hexagonal faces shown in FIG. 2D. In an embodiment, the engagement end 228 can be engaged by a user for manual manipulation of the valve 226. In an embodiment, the engagement end 228 can be engaged by automation to automatically manipulate the valve 226, for example in response to signals from a controller such as the controller 404 shown in FIG. 4 and described below. In an embodiment, instead of engagement end 228, an actuator can be provided in valve 226 allowing for automatic control of the position of valve 226. The actuator can be configured to be responsive to signals from a controller such as the controller 404 shown in FIG. 4 and described below. The needle end 230 is configured such that flow can be controlled based on its position. Aperture engaging body 232 allows the valve 226 to be retained in one of the valve apertures 216, 218, 220 such that the valve 226 is securely retained while remaining capable of being manipulated.

Figure 3:
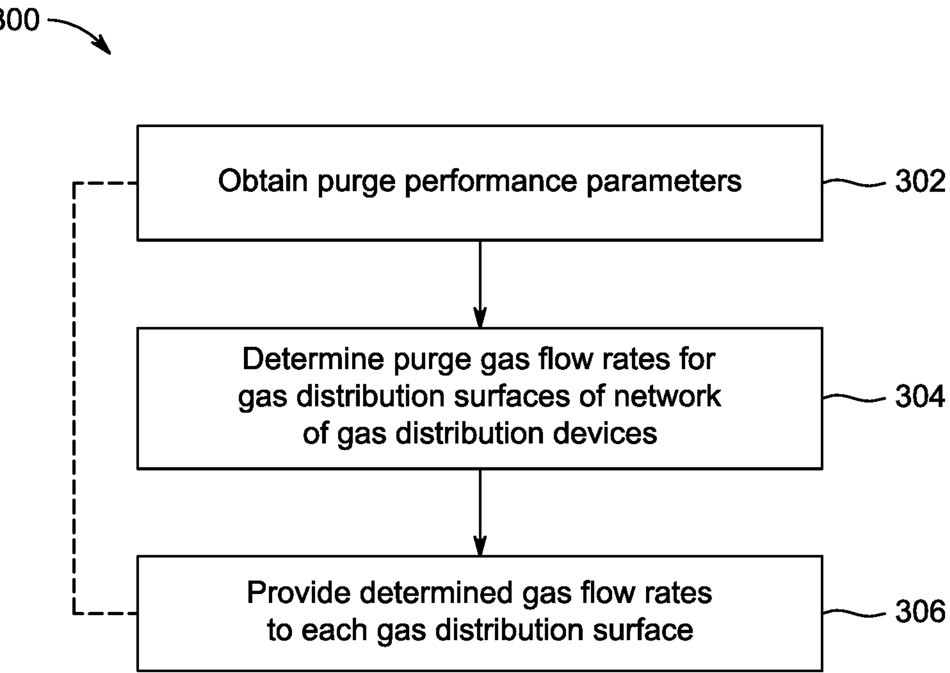
FIG. 3 shows a flowchart of a method for controlling flow of purge gas into a substrate container.

FIG. 3 shows a flowchart of a method for controlling flow of purge gas into a substrate container. Method 300 includes obtaining one or more purge performance parameters 302. Method 300 further includes determining purge gas flow rates for each of a plurality of gas distribution surfaces of a network of gas distribution devices of the substrate container 304. Method 300 also includes configuring a purge flow distribution system of the substrate container to divide one or more input flows such that the determined purge gas flow rates are provided to each of the plurality of gas distribution surfaces 306.

Purge performance parameters are obtained at 302. The purge performance parameters can be any suitable parameter reflective of the effectiveness of the purging of the substrate container, such as flow rates or velocities of gas exiting the substrate containers, yield of the substrates being processed, pressure at one or more locations within, at or near the substrate container, or the detection of contaminants such as outgassing, particulate matter, relative humidity, ionic contaminants, oxygen or volatile organic compounds (VOCs). The substrate container can be any suitable container, for example a FOUP, a reticle pod, or the like. The purge performance parameters can be obtained, for example, through detection by sensors, analysis of substrates, modeling of conditions, or any other suitable method of determining the particular purge performance parameter being obtained at 302. In an embodiment, a single purge performance parameter is obtained at 302. In an embodiment, multiple purge performance parameters can be obtained at 302.

Purge gas flow rates are determined at 304. The purge gas flow rates can be determined at 302 based on the one or more purge performance parameters. Purge gas flow rates can be selected based on the effect of the flow rates on the purge performance parameters, for example to improve and/or optimize the purge performance parameters. In an embodiment, the purge gas flow rates can be selected based on a process the substrate container is being used in, such as purge gas flow rates for a particular process being performed on substrates within the container. In an embodiment, the purge gas flow rates are determined for each of a plurality of gas distribution surfaces of a network of gas distribution devices included in the substrate container. In an embodiment, the purge gas flow rates can be based on modeling of the one or more purge performance parameters. For example, modeling of flows, relative humidity values, oxygen concentrations, and/or pressures within the substrate container, models of rates of outgassing, or the like. In an embodiment, the purge gas flow rates can be determined based on historical and/or experimental data regarding the one or more purge performance parameters, such as data associating product yields and/or humidity within substrate containers with particular purge gas flow rates, historical data regarding rates of outgassing and/or particulate, or the like. In an embodiment, the position the substrate container occupies in a tool or stocking system, or the like can be accounted for when determining the purge gas flow rates. In an embodiment, the purge gas flow rates can be determined during a process including the substrate container. For example, the purge gas flow rates can be determined in response to a current state of the one or more purge performance parameters during the process, such as pressures or humidity values within the substrate container, velocities of flow within or exiting the substrate container, or the like.

A purge flow distribution system of the substrate container is configured to divide one or more input flows such that the determined purge gas flow rates are provided to each of the plurality of gas distribution surfaces 306. The configuration of the purge flow distribution system at 306 can be accomplished by controlling one or more flow controls of the purge flow distribution system to alter the flow to one or more of the gas distributing devices included therein. The control of the flow controls can be, for example, an automated actuation of the flow control. In an embodiment, the automated actuation can be carried out by actuators included in the purge flow distribution system. In an embodiment, the automated actuation can be carried out by actuators external to the substrate container that engage with features of the flow controls of the substrate container. As non-limiting examples, actuators external to the substrate container can be included in a tool or stocking system that the substrate container is used with or held within, or provided as a separate automation system. In an embodiment, the control of the flow controls can be providing a notification regarding how the flow controls are to be adjusted, for example by a technician manually operating the flow controls. In an embodiment, the method 300 can iterate following the configuration of the purge flow distribution system, obtaining the one or more purge performance parameters 302 and determining the purge gas flow rates at 304, and further configuring the purge flow distribution system 306 if further changes to the division of the input flows are to be made. In an embodiment, method 300 is performed continuously. In an embodiment, method 300 is iterated according to a schedule. In an embodiment, method 300 is carried out in response to an event, such as values of purge performance parameters crossing predetermined thresholds.

Figure 4:
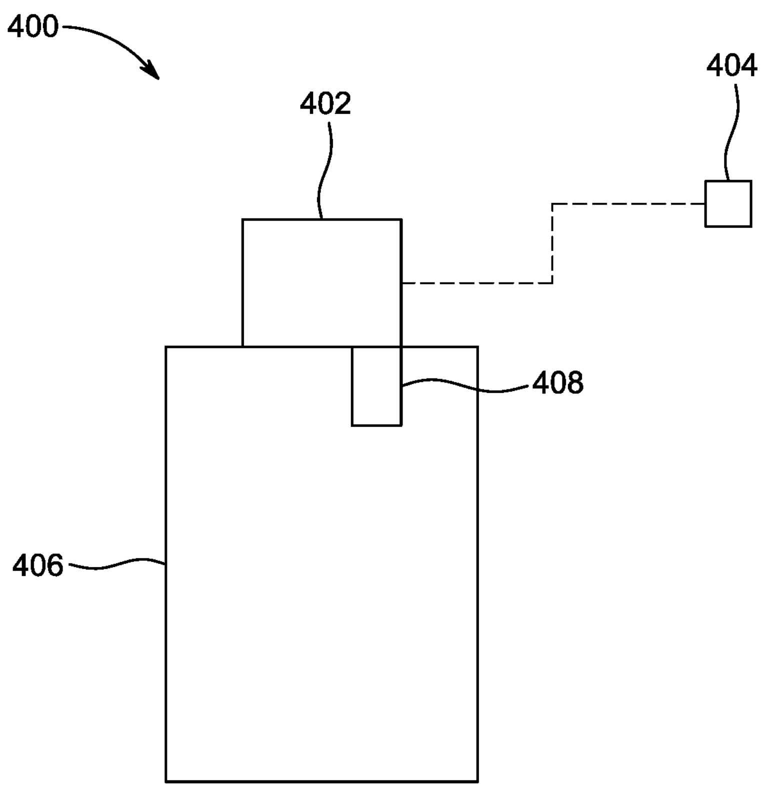
FIG. 4 shows a substrate container purging system according to an embodiment.

FIG. 4 shows a substrate container purging system according to an embodiment. Substrate container purging system 400 includes substrate container 402 and controller 404. Optionally, the substrate container purging system 400 can further include tool 406, including purge gas supply 408.

Optionally, sensors 410 can be included in the substrate container purging system 400.

Substrate container 402 can be any substrate container including a purge flow distribution system, such as the substrate container 100 described above and shown in FIGS. 1A and 1B. In an embodiment, substrate container 402 is a FOUP. In an embodiment, substrate container 402 is a reticle pod. The purge flow distribution system of substrate container 402 can divide a purge gas flow, such as from purge gas supply 408 among a plurality of gas distribution surfaces of a network of gas distribution devices in the substrate container 402. In the embodiment shown in FIG. 4, the flow controls of the purge flow distribution system included in substrate container 402 can be automatically actuated, such that the flow controls can be controlled by signals from the controller 404.

Controller 404 is operatively connected to flow controls included in substrate container 402. Being operatively connected to the substrate container means that the controller 404 is connected such that it can communicate with the flow controls of substrate container 402 to at least send command signals to the flow controls. The connection can be wired or wireless. In an embodiment, the controller 404 can be included on the substrate container 402. In an embodiment, the controller 404 can be separate from the substrate container 402. In an embodiment, the controller 404 can be included in tool 406. In an embodiment, the controller 404 can be included in a control unit (not shown). In an embodiment, controller 404 can be configured to receive signals from sensors 410. The sensors 410 can be connected to the controller 404 through wired or wireless means. Controller 404 can be configured to control the purge flow distribution system of the substrate container 402 to provide determined purge flow gas rates. In an embodiment, controller 404 can determine the purge gas flow rates and control the purge flow distribution system of the substrate container 402 to implement the method 300 as described above and shown in FIG. 3. In an embodiment, the controller 404 can be configured to determine the purge gas flow rates and send the control signals to substrate container 402 during a process being performed in or using the substrate container 402.

Tool 406 can be any suitable tool used in processing or storage of the substrates contained within substrate container 402. In an embodiment, controller 404 can be included in or on tool 406. In an embodiment, controller 404 is separate from the tool 406. In an embodiment, tool 406 can be an equipment front end module (EFEM) and the substrate container interfaces with tool 406 at a load port. In an embodiment, the tool 406 can be a stocker used for storage of substrate containers including substrate container 402. The stocker can be configured to store any suitable substrate containers such as FOUPs, reticle pods, or the like. In an embodiment, tool 406 can be a reticle processing tool when substrate container 402 is a reticle pod. The tool 406 can include purge gas supply 408. Purge gas supply 408 is configured to provide a flow of purge gas to the substrate container 402. The purge gas supply 408 can interface with substrate container 402, for example, by way of a load port. The purge gas supply 408 can provide any suitable purge gas to the substrate container 402, for example nitrogen, CDA, or the like.

Sensors 410 can be included in system 400. In an embodiment, sensors 410 can be any suitable sensors capable of detecting one or more purge performance parameters, for example, pressure, relative humidity, presence and/or amount of particulate, presence and/or amount of volatile organic compounds, velocities and/or rates of flows within or exiting the substrate container, or the like. The sensors 410 can be connected to controller 404 such that the sensors 410 can provide signals indicative of the one or more purge performance parameters to the controller 404. In an embodiment, the sensors 410 can be configured to measure the one or more purge performance parameters during a process occurring within or using the substrate container 402. In an embodiment, the sensors 410 can provide information regarding the one or more purge performance parameters to the controller 404 in real time. In an embodiment, the sensors 410 can be included in any suitable location in or near the system 400, for example being included in tool 406, substrate container 402, in proximity to substrate container 402, and the like.

ASPECTS

It is understood that any of aspects 1-9 can be combined with any of aspects 10-20.

Aspect 1. A method of controlling flow of purge gas into a substrate container, comprising:

determining purge gas flow rates for each of a plurality of gas distribution surfaces of a network of gas distribution devices of the substrate container, based on one or more purge performance parameters; and configuring a purge flow distribution system of the substrate container to divide one or more input flows such that the determined purge gas flow rates are provided to each of the plurality of gas distribution surfaces.

Aspect 2. The method according to aspect 1, wherein the purge flow distribution system includes a plurality of flow paths, each flow path configured to allow flow of purge gas to one of the plurality of gas distribution surfaces, the flow paths configured such that when a predetermined input of the purge gas is provided, each of the plurality of gas distribution surfaces provide the determined purge gas flow rates.

Aspect 3. The method of according to any of aspects 1-2, wherein the substrate container comprises one or more flow controls included in the purge flow distribution system, the one or more flow controls configured to direct purge gas to each of the plurality of gas distribution surfaces, the method further comprising adjusting the one or more flow controls to control the flow of the purge gas to the plurality of gas distribution surfaces.

Aspect 4. The method according to aspect 3, wherein the one or more flow controls include a valve.

Aspect 5. The method according to any of aspects 3-4, wherein the one or more flow controls include a flow restrictor.

Aspect 6. The method according to any of aspects 1-5, wherein the determined purge gas flow rates are different for each of the plurality of gas distribution surfaces.

Aspect 7. The method according to any of aspects 1-6, wherein determining the purge gas flow rates is performed during when substrates are located in the substrate container.

Aspect 8. The method according to any of aspects 1-7, wherein determining the purge gas flow rates is performed in response to a change in an operational state of the substrate container.

Aspect 9. The method according to any of aspects 1-8, wherein determining the purge gas flow rates is performed in response to a change in at least one of the one or more purge performance parameters.

Aspect 10. A substrate container, comprising:

a shell defining an interior space;

a plurality of gas distribution surfaces located within the interior space;

a purge gas inlet configured to receive a purge gas;

a purge flow distribution system, connected to the purge gas inlet, the purge flow distribution system including:

a plurality of flow paths, each flow path configured to provide the purge gas to one of the plurality of gas distribution surfaces; and one or more flow controls, each of the one or more flow controls configured to affect flow through at least one of the plurality of flow paths.

Aspect 11. The substrate container according to aspect 10, wherein the one or more flow controls include a valve.

Aspect 12. The substrate container according to aspect 11, wherein the valve is one of a needle valve, a ball valve, or a butterfly valve.

Aspect 13. The substrate container according to any of aspects 10-12, wherein the one or more flow controls include a flow restrictor.

Aspect 14. A substrate container purging system, comprising the substrate container according to any of aspects 10-13 and a controller, the controller configured to adjust at least one of the one or more flow controls such that the plurality of gas distribution surfaces provide target purge gas flow rates.

Aspect 15. The substrate container purging system according to aspect 14, wherein the controller is further configured to determine the target purge gas flow rates based on one or more purge performance parameters.

Aspect 16. The substrate container purging system according to aspect 15, wherein the controller is configured to determine the target purge gas flow rates during when substrates are located in the substrate container.

Aspect 17. The substrate container purging system according to any of aspects 15-16, wherein the controller is configured to determine the target purge gas flow rates in response to a change in an operational state of the substrate container.

Aspect 18. The substrate container purging system according to any of aspects 15-17, wherein determining the target purge gas flow rates is performed in response to a change in at least one of the one or more purge performance parameters.

Aspect 19. The substrate container purging system according to any of aspects 14-18, wherein the controller is configured to receive the target purge gas flow rates.

Aspect 20. The substrate container purging system according to any of aspects 14-19, further comprising one or more sensors configured to measure one or more purge performance parameters.

The examples disclosed in this application are to be considered in all respects as illustrative and not limitative. The scope of the invention is indicated by the appended claims rather than by the foregoing description; and all changes which come within the meaning and range of equivalency of the claims are intended to be embraced therein.

What is claimed is:

1. A method of controlling flow of purge gas into a substrate container, comprising:

determining purge gas flow rates for each of a plurality of gas distribution surfaces of a network of gas distribution devices of the substrate container, based on one or more purge performance parameters; and configuring a purge flow distribution system of the substrate container, wherein the purge flow distribution system includes:

a plurality of flow paths, each flow path configured to provide purge gas to at least one of the plurality of gas distribution surfaces; and a plurality of flow controls, each of the plurality of flow controls configured to individually adjust the flow provided to one of the plurality of gas distribution surfaces, wherein the configuring the purge flow distribution system of the substrate container comprises configuring the purge flow distribution system to divide one or more input flows such that the determined purge gas flow rates are provided to each of the plurality of gas distribution surfaces.

2. The method of claim 1, wherein the flow paths are configured such that when a predetermined input of the purge gas is provided, each of the plurality of gas distribution surfaces provide the determined purge gas flow rates.

3. The method of claim 1, wherein the method further comprising adjusting the plurality of flow controls to control the flow of the purge gas to the plurality of gas distribution surfaces.

4. The method of claim 1, wherein the plurality of flow controls includes a valve.

5. The method of claim 1, wherein the determined purge gas flow rates are different for each of the plurality of gas distribution surfaces.

6. The method of claim 1, wherein determining the purge gas flow rates is performed during when substrates are located in the substrate container.

7. The method of claim 1, wherein determining the purge gas flow rates is performed in response to a change in an operational state of the substrate container.

8. The method of claim 1, wherein determining the purge gas flow rates is performed in response to a change in at least one of the one or more purge performance parameters.

9. A substrate container, comprising:

a shell defining an interior space;

a plurality of gas distribution surfaces located within the interior space;

a purge gas inlet configured to receive a purge gas;

a purge flow distribution system, connected to the purge gas inlet, the purge flow distribution system including:

a plurality of flow paths, each flow path configured to provide the purge gas to one of the plurality of gas distribution surfaces; and one or more flow controls, each of the one or more flow controls configured to individually adjust the flow provided to one of the plurality of gas distribution surfaces.

10. The substrate container of claim 9, wherein the one or more flow controls include a valve.

11. The substrate container of claim 10, wherein the valve is one of a needle valve, a ball valve, or a butterfly valve.

12. A substrate container purging system, comprising the substrate container of claim 9 and a controller, the controller configured to adjust at least one of the one or more flow controls such that the plurality of gas distribution surfaces provide target purge gas flow rates.

13. The substrate container purging system of claim 12, wherein the controller is further configured to determine the target purge gas flow rates based on one or more purge performance parameters.

14. The substrate container purging system of claim 13, wherein the controller is configured to determine the target purge gas flow rates during when substrates are located in the substrate container.

15. The substrate container purging system of claim 13, wherein the controller is configured to determine the target purge gas flow rates in response to a change in an operational state of the substrate container.

16. The substrate container purging system of claim 13, wherein determining the target purge gas flow rates is performed in response to a change in at least one of the one or more purge performance parameters.

17. The substrate container purging system of claim 12, wherein the controller is configured to receive the target purge gas flow rates.

18. The substrate container purging system of claim 12, further comprising one or more sensors configured to measure one or more purge performance parameters.

* * * * *